United States Patent [19]

Choi

[11] Patent Number: 5,461,337
[45] Date of Patent: Oct. 24, 1995

[54] SYSTEM FOR PROVIDING LINEAR TIME POSITION VARIATIONS IN WRITE PRECOMPENSATION CIRCUIT FOR USE IN DISK DRIVE SYSTEMS

[75] Inventor: Davy H. Choi, Garland, Tex.

[73] Assignee: Texas Instruments Incorporated, Dallas, Tex.

[21] Appl. No.: 183,612

[22] Filed: Jan. 18, 1994

[51] Int. Cl.⁶ .................................... H03K 5/22
[52] U.S. Cl. ................... 327/346; 327/58; 327/63
[58] Field of Search .................... 307/499, 350, 307/351, 352, 355, 354, 356, 360; 328/119, 142; 341/144, 152; 327/103, 346, 355, 334, 58, 63, 72, 77, 80, 90

[56] References Cited

U.S. PATENT DOCUMENTS

| | | | |
|---|---|---|---|
| 3,906,247 | 9/1975 | Heffner | 307/350 |
| 4,229,108 | 10/1980 | Childers | 356/443 |
| 4,549,098 | 10/1985 | Fushiki | 307/352 |
| 4,712,091 | 12/1987 | Schoofs et al. | 341/144 |
| 4,874,964 | 10/1989 | Kondo | 341/144 |
| 5,155,386 | 10/1992 | Abdi | 307/360 |

Primary Examiner—Timothy P. Callahan
Assistant Examiner—T. Lam
Attorney, Agent, or Firm—W. Daniel Swayze, Jr.; Wade J. Brady, III; Richard L. Donaldson

[57] ABSTRACT

A source of equally spaced timing signals which includes a first signal source providing a first signal tracing an essentially exponential voltage curve, a second signal source including a transistor having a control electrode and an electron flow path therethrough having a voltage drop $V_{BE}$ thereacross, a voltage source providing a voltage $V_{CC}$ coupled to one end of the electron flow path, a resistance $R_L$ coupled between the control electrode and the voltage source, the other end of the flow path providing a second voltage signal in accordance with the equation $V_i = V_H - I_i R_L$ for i=1 to n where $I_i = (V_H/R_L)(1-e^{-i\alpha})$ and $V_H = V_{CC} - V_{BE}$ and a comparator providing a timing signal whenever the second voltage signal is greater than the first signal.

13 Claims, 2 Drawing Sheets

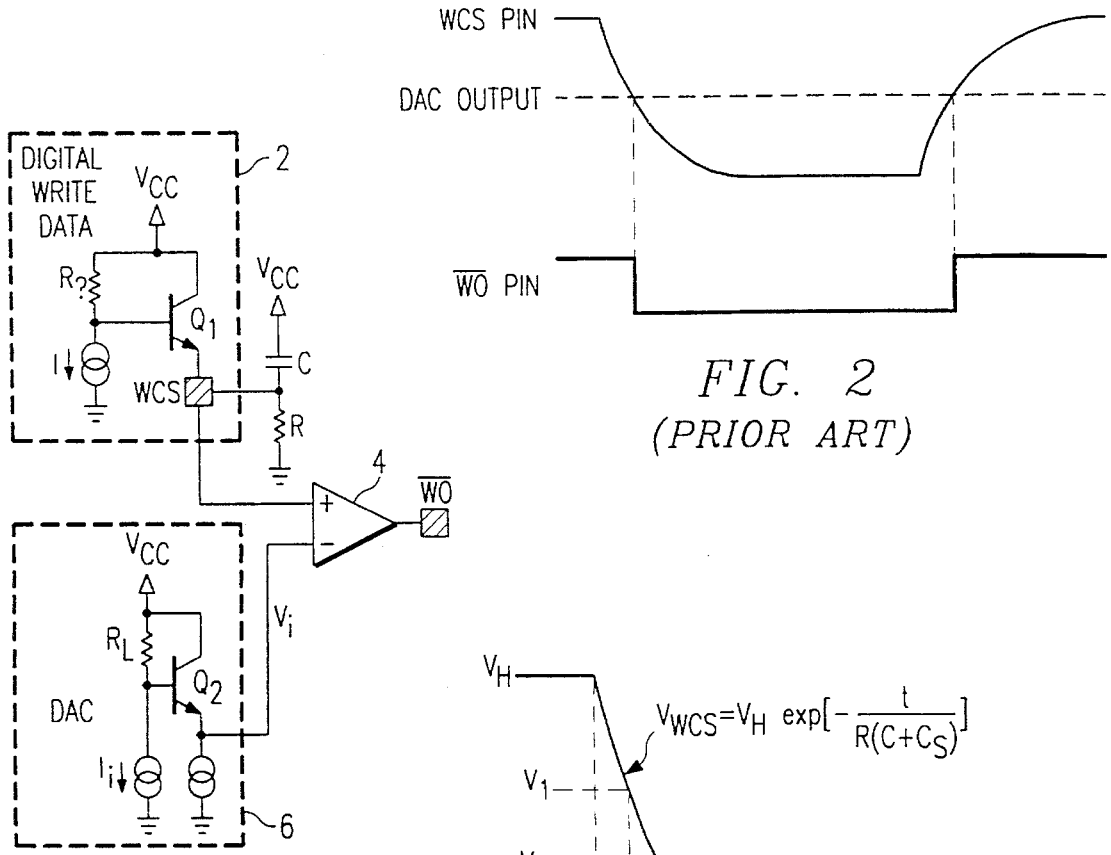
FIG. 2
(PRIOR ART)
FIG. 1
(PRIOR ART)
FIG. 3
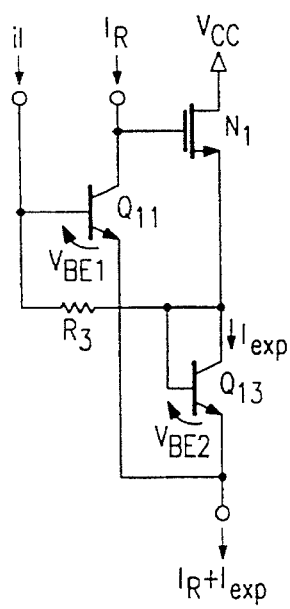
FIG. 5
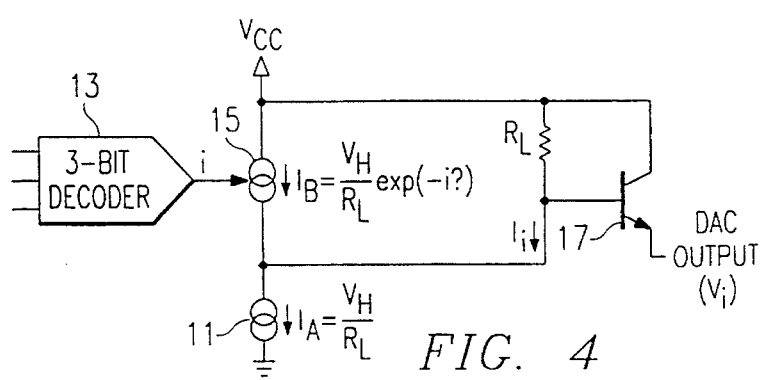
FIG. 4

SYSTEM FOR PROVIDING LINEAR TIME POSITION VARIATIONS IN WRITE PRECOMPENSATION CIRCUIT FOR USE IN DISK DRIVE SYSTEMS

BACKGROUND OF THE INVENTION

FIELD OF THE INVENTION

This invention relates to a system for providing indicia of linear or equally spaced time position variations, particularly for use in conjunction with write precompensation circuits to compensate for bit shift.

BRIEF DESCRIPTION OF THE PRIOR ART

There has been a problem in the prior art in obtaining timing signals having equal spacing therebetween in general and particularly in connection with write precompensation circuits. Write precompensation circuitry is provided to compensate for the bit shift caused by the intersymbol interference. In order to increase disk storage capacity, adjacent stored bits are placed very close together. The "1" bits are represented by alternating magnetic fluxes with the peak positions representing the data information. When two signals are superimposed upon each other, a composite of the two signals is obtained. This causes a shift of the peak position from the ideal. In the past, one way of compensating for this peak shift problem has been to write the data closer together than required by a certain amount at first so that the peak shift process would push the adjacent bits apart later and cause the final peaks to be in the idealized location. A discussion of this problem is set forth in *Electronics*, Apr. 21, 1982 at page 111.

A prior art write compensation circuit is shown by the block diagram implementation in FIG. 1 which recognizes specific write data patterns and can add or subtract delays in the time position of write data bits to counteract the read back bit shift. In this prior art circuit, all of the circuitry including pads WCS and WO bar are on a single chip and capacitor C and resistance R are off chip. The magnitude of the time shift of the signal, which is at the output at the WO bar pad, is determined by the RC network composed of resistance R and capacitor C which are external to the chip in accordance with the equation:

$$TPC = WP\alpha R(C+C_S) \quad (1)$$

where TPC is time position compensation, $\alpha$ is a constant that provides the best fit of measured results, $C_S$ is stray capacitance at the WCS pad and, for example, WP=−3, −2, −1, 0, +1, +2, +3.

In the circuit of FIG. 1, a digital write data signal is provided by a digital write data circuit 2 and provides an output signal shown in FIG. 2 as WCS, this signal being applied to the positive input of a comparator 4. A digital to analog converter (DAC) 6 generates, for example, seven different DC levels or WP in the above equation, one at a time, at the negative input of the comparator 4 whose output is the WO bar output as shown in the timing diagram in FIG. 2.

As can be seen in FIG. 2, the WO bar signal is high until the voltage level at the negative input of the comparator 4 provided by the DAC is the same as or higher than the voltage level from the circuit 2. The DAC 6 generates the seven different voltage levels at seven different time positions.

Only the falling or trailing edges of signals at the WCS and WO bar pads are used for timing. As can be seen in FIG. 2, the WCS signal follows an exponential decay waveform, this occurring only when transistor $Q_1$ of FIG. 1 is turned off due to the presence of the R and C components which are external to the chip. This is the case for a data bit "1" where current I is switched on. Essentially, the timing shift only applies to a data bit "1" as explained above. Thus, the output level of DAC 6 has to be moved in a nonlinear but controlled fashion in order to obtain "equal" time steps as the DAC output changes, this corresponding to the WP parameter stepping through the seven steps from −3 to +3 as stated in the TPC equation (1) supra. This has been a problem in the prior art.

SUMMARY OF THE INVENTION

In accordance with the present invention, the above described problem is resolved and there is provided a DAC which is capable of providing a nonlinear output to compensate for the nonlinearity in the output of the digital data write circuit 2.

The voltage $V_{WCS}$ on the WCS pad in FIG. 1 is shown in FIG. 3 as a solid trace which decays exponentially from $V_H$, where $V_H$ is $V_{CC}-V_{BE}$, $V_{CC}$ is the supply voltage and $V_{BE}$ is the base to emitter voltage of a bipolar transistor in an ECL circuit. $V_H$ is defined in the output stage of an ECL-type circuit shown in FIG. 1 as follows: The current I is turned on or off, depending upon the logic state of the circuit. The highest output voltage is obtained when I=0, in which case the voltage at pad WCS is $V_{out}=(V_{CC}-IR_1-V_{BE})=(V_{CC}-V_{BE})$, where $R_1$ is the load resistance at the base of transistor $Q_1$. $V_{WCS}$ is described by the following equation as a function of time t:

$$V_{WCS}=V_H \exp(-t/(R\ C_T))$$

where $C_T=C+C_S$ (stray capacitance).

As the output voltage of DAC 6 ($V_1 \ldots V_7$ or $V_i$ of FIG. 3) intersects $V_{WCS}$ at different points, seven coordinates are generated which are represented as $(t_i, V_i)$ where i=1 to 7 as shown in FIG. 3. In order to match this nonlinearity of the output at pad WCS from the circuit 2, the DAC output stage is constructed as shown in FIG. 1, where $R_L$ is the load resistance. $V_i$ represents seven equations since the largest "i" in this example is 7 and "i" represents n equations when i=n and is thus described by the equation:

$$V_i = V_{CC}-I_i R_L-V_{BE}=V_H-I_i R_L. \quad (2)$$

There is a one-to-one mapping between $I_i$ and $V_i$ as indicated in the above equation. $V_i$ is defined to be $V_1$ for $I_1$, $V_2$ for $I_2$, etc. The purpose of this mathematical analysis is to find the requirements on $I_i$ in generating $V_i$ so that seven equal time intervals are provided and defined by $(t_i-t_{i-1})$ for i=1 to 7 and $t_o=0$ or, more generally, n equal time intervals for i=1 to n.

At intersection points, $V_{WCS}=V_i$ and the above $V_{WCS}$ equation in $V_i$ generates a set of seven equations for i=1 to 7 as follows:

$$V_i = V_H \exp(-t_i/(R\ C_T))$$

or $$t_i = R\ C_T \ln(V_H/V_i).$$

Equating consecutive time intervals, i.e., $t_2-t_1=t_1$, $t_3-t_2=t_2-t_1$, etc., results in six equations for i=1 to 6 with $V_o=V_H$.

Accordingly, $$V_i V_j = V_{i-1} V_{i+1} \quad (3)$$

The above TPC equation (1) is evaluated for one time interval to obtain the equation $t_1 = \alpha R\, C_T$. With $V_1 = V_H \exp(-t_1/(R\, C_T))$, there is derived the equation:

$$V_1 = V_H e^{-\alpha} \quad (4)$$

Manipulation of the equations (2), (3) and (4) results in the equation for i=1 to 7 of:

$$I_i = (V_H/R_L)(1 - e^{-i\alpha}).$$

Therefore, the requirements on $I_i$ for the generation of equal time steps used in write precompensation applications are provided and it is merely necessary to substitute a DAC circuit for the prior art DAC 6 of FIG. 1 which operates according to the equation for i=1 to n of:

$$I_i = (V_H/R_L)(1 - e^{-i\alpha}).$$

BRIEF DESCRIPTION OF THE DRAWINGS

FIG. 1 is a block diagram of a prior art write compensation circuit;

FIG. 2 is a timing diagram showing the operation of the write precompensation circuit of FIG. 1;

FIG. 3 is a timing diagram showing the intersections of the $V_{WCS}$ waveform and the DAC output $V_i$ as $V_i$ moves from $V_1$ to $V_7$, generating seven equal time intervals;

FIG. 4 is a block diagram implementation of linear time variations based upon the equation $I_i = (V_H/R_L)(1-e^{-i\alpha})$ for i=1 to 7;

FIG. 5 is a circuit diagram showing the generation of the currents used in FIG. 6 in accordance with the present invention.

DESCRIPTION OF THE PREFERRED EMBODIMENT

Figure 6:
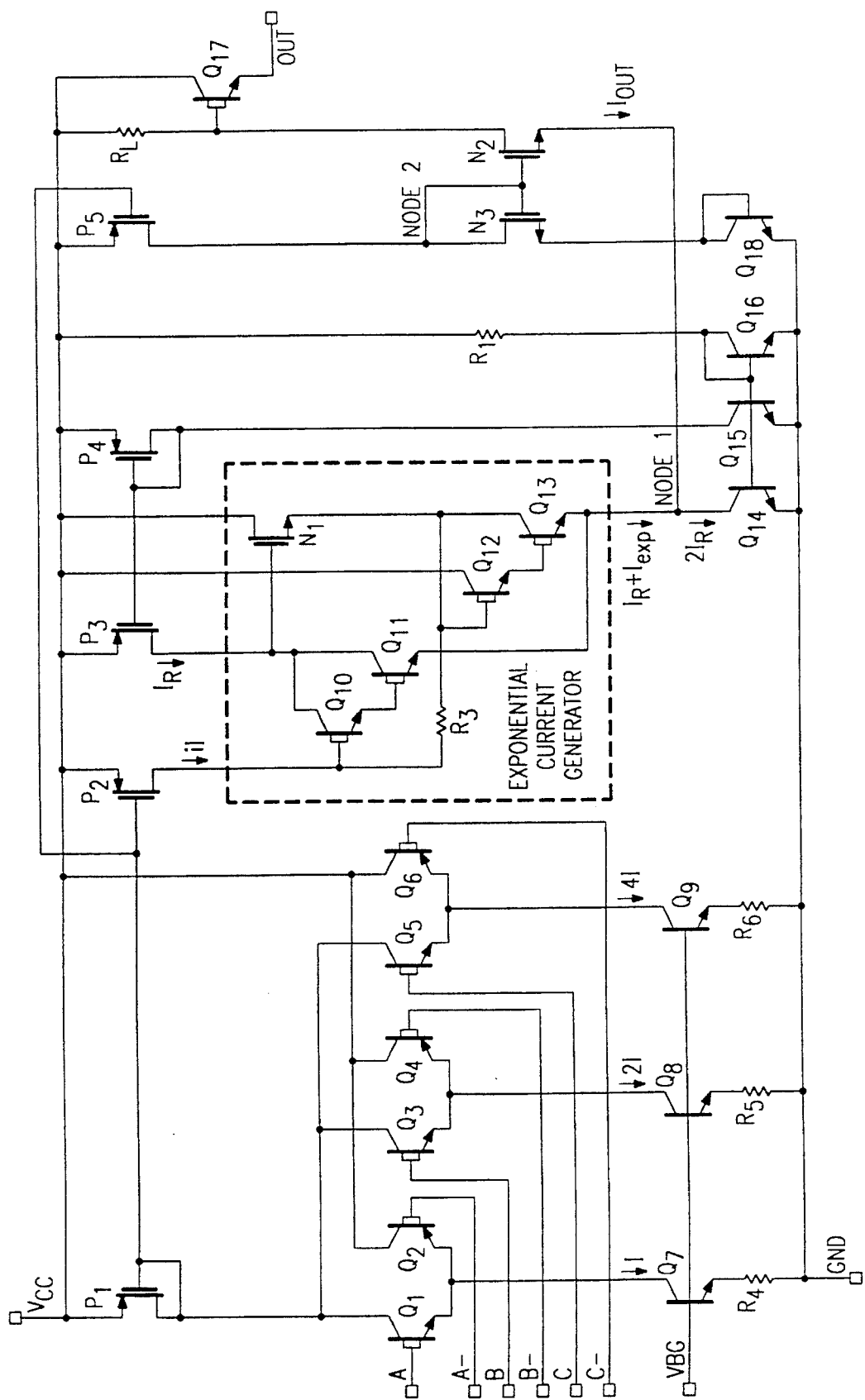
FIG. 6 is a circuit diagram of a DAC which can be used in accordance with the present invention.

A block diagram implementation of linear time position variations based upon the equation $I_i = (V_H/R_L)(1-e^{-i\alpha})$ which is equation (5) above is shown in FIG. 4. A reference current sink circuit 11 is provided which operates in accordance with the equation $I_A = V_H/R_L$. A 3-bit decoder 13 generates the index i for i=1 to 7 according to the decoding scheme interpreting specific write data patterns. The 3-bit decoder controls a current source circuit 15 which operates in accordance with the equation $I_B = (V_H/R_L)e^{-i\alpha}$. Therefore, a net current $I_i = I_A - I_B$ is provided to control the transistor 17, the emitter of which is the output of the DAC, $V_i$ for i=1 to 7 and $I_i = (V_H/R_L)(1-e^{-i\alpha})$. The matching characteristics of this type of circuit are met in a monolithic integrated circuit. This circuit is utilized in the circuit of FIG. 1 in place of the DAC 6 therein to provide the equally spaced timing pulses in accordance with the equations as set forth hereinabove.

Referring now to FIG. 5, there is shown a circuit diagram of an exponential current generator in accordance with the present invention. This circuit includes two inputs, iI and $I_R$ and one output, $I_R + I_{exp}$. The input iI is coupled to the base of an NPN transistor $Q_{11}$ and then, through a resistance $R_3$ to the base and collector of an NPN transistor $Q_{13}$. The emitter of transistor $Q_{13}$ is the output $I_R + I_{exp}$. The input $I_R$ is coupled to the collector of transistor $Q_{11}$, the emitter of which is coupled to the output $I_R + I_{exp}$. The input $I_R$ is also coupled to the gate of transistor $N_1$, the current path of transistor $N_1$ being coupled between $V_{CC}$ potential and the collector of transistor $Q_{13}$.

The equations describing the circuit of FIG. 5 are as follows:

$$(iI)R_3 + V_{BE2} = V_{BE1}$$

$$I_R = I_S \exp(V_{BE1}/V_T)$$

$$I_{exp} = I_S \exp(V_{BE2}/V_T)$$

where $V_{BE1}$ is the base to emitter voltage of transistor $Q_{11}$, $V_{BE2}$ is the base to emitter voltage of transistor $Q_{13}$, $I_S$ is the saturation current of a bipolar transistor and $V_T = kT/q$, where k is Boltzmann's constant, T is the absolute temperature and q is the charge of an electron.

The above equations can be simplified into:

$$I_{exp} = I_R \exp(-((iI)R_3)/V_T)$$

Therefore, the output current is given by:

$$I_R + I_{exp} = I_R[1 + \exp(-((iI)R_3)/V_T)] \quad (6)$$

Transistor $N_1$ biases the collector of transistor $Q_{11}$ at a sufficiently high voltage to ensure that transistor $Q_{11}$ operates in its saturation region.

Referring now to FIG. 6, there is shown a schematic diagram of a circuit which provides the currents as set forth in FIG. 4 and which can be used as a DAC in accordance with the present invention.

The exponential current generator described in conjunction with FIG. 5 is incorporated into the circuit of FIG. 6. Current iI is forced into resistance $R_3$ and current $I_R$ is forced into transistor $Q_{11}$. Transistors $Q_{10}$ and $Q_{12}$ are added to the circuit of FIG. 5 to minimize base current errors. The sum of the emitter currents from transistors $Q_{11}$ and $Q_{13}$ is given by the equation:

$$I_R + I_{exp} = I_R[1 + \exp(-((iI)R_3)/2V_T)] \quad (7)$$

This equation is different from equation (6) above by a "2" factor which is present to account for the addition of transistors $Q_{10}$ and $Q_{12}$.

A reference current $I_R$ is provided by placing resistance $R_1 = R_L$ and the base to emitter voltage $V_{BE}$ of transistor $Q_{16}$ between $V_{CC}$ and ground or reference voltage. Thus, current $I_R = (V_{CC} - V_{BE})/R_L$ flows through transistor $Q_{16}$. The two current mirrors, transistors $Q_{15}/Q_{16}$ and transistors $P_3/P_4$ then force current $I_R$ into transistor $P_3$ as well. Another 2× current mirror composed of transistors $Q_{14}/Q_{16}$ (the size of transistor $Q_{14}$ is twice that of transistor $Q_{16}$) forces a current $2I_R$ into transistor $Q_{14}$ as shown in FIG. 6.

Transistor $Q_1$ to $Q_9$ and resistances $R_4$ to $R_6$ form a standard digital to analog converter (DAC). By ratioing transistors $Q_7$ to $Q_9$ and resistances $R_4$ to $R_6$ appropriately, a current I is provided in transistor $Q_7$, a current 2I is provided in transistor $Q_8$ and a current 4I is provided in transistor $Q_9$. The three switches, $Q_1/Q_2$, $Q_3/Q_4$ and $Q_5/Q_6$ are controlled by signals A/A—, B/B— and C/C— respectively. Depending upon the logic states of signals A, B and C, there will be a signal current 0, I, 2I, . . . , 7I passing through transistor $P_1$, this current being referred to herein as iI, where i=0, 1, 2, . . . , 7. The current mirror $P_1/P_2$ then forces iI into transistor $P_2$.

As discussed above, with current iI from transistor $P_2$ travelling through resistance $R_3$ and current $I_R$ travelling from transistor $P_3$ into transistor $Q_{11}$, the current ($I_R + I_{exp}$)

described by equation (7) is provided at the node 1 junction as shown in FIG. 6. Also, as previously demonstrated, there is a current $2I_R$ leaving the node 1 junction and entering transistor $Q_{14}$. Summing currents at node 1 results in:

$$I_R + I_{exp} + I_{out} = 2 I_R$$

$$\begin{aligned} I_{out} &= I_R - I_{exp} \\ &= I_R[1 - \exp(-((iI)R_3)/2V_T)] \\ &= I_R[1 - \exp(-i\alpha)] = I_R[1 - e^{-i\alpha}] \end{aligned} \quad (8)$$

where $$\alpha = IR_3/2V_T. \quad (9)$$

It is apparent that the current $I_{out}$ as set forth in equation (8) is identical to current $I_i$ set forth in equation (5) and shown in FIG. 4.

Transistor $N_2$ isolates node 1 from the base of transistor $Q_{17}$. The gate of transistor $N_2$ or node 2 is biased up by transistor $N_3$ and $Q_{18}$ to replicate the connection of transistors $N_2/Q_{14}$. The current mirror composed of transistors $P_2/P_5$ forces current iI into transistor $N_3$. As the index i increases, current iI increases, this, in turn, increasing the current $I_{out}$ in accordance with equation (8). As a result, node 2 moves up due to the increased current iI in transistor $N_3$ and increased current $I_{out}$ in transistor $N_2$. Accordingly, the output stage bias maintains its proper balance.

It is desirable that the coefficient $\alpha$ given by equation (9) be temperature invariant. As shown in FIG. 6, current I is set up as:

$$I = (V_{BG} - V_{BE})/R \quad (10)$$

where $V_{BG}$ is a temperature-invariant bandgap reference voltage. Since $V_{BE}$ has a negative temperature coefficient, current I as shown in equation (10) will increase as temperature increases. Because $V_T = kT/q$ also increases with temperature, $\alpha$ will be temperature invariant.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. A source of equally spaced timing signals, comprising:
   a first voltage signal source providing a voltage tracing an essentially exponential voltage;
   a second voltage signal source providing a voltage $V_i = V_H - I_i R_L$ coupled to a current path including a transistor having a control electrode;
   an electron flow path therethrough controlled by said control electrode; and
   a voltage drop $V_{BE}$ between said control electrode and said electron flow path;
   a resistance $R_L$ disposed between a third voltage source $V_{CC}$ and said control electrode; and
   a current generator coupled between said control electrode and a reference voltage source which provides a current $I_i$ at said control electrode according to the equation for i=1 to n time intervals of: $I_i = (V_H/R_L)(1-e^{-i\alpha})$ where $\alpha = IR_L/2V_T$ and $V_H = V_{CC} - V_{BE}$; and
   a comparator providing a timing signal whenever said voltage $V_i$ becomes greater than said essentially exponential voltage.

2. A source as set forth in claim 1, further including a current source disposed between said current path and said reference voltage source providing said voltage $V_i = V_H - I_i R_L$ at said current path.

3. A source as set forth in claim 1, further including means to vary the value of i.

4. A source as set forth in claim 3, wherein said means to vary the value of i is a decoder.

5. A source of equally spaced timing signals, comprising:
   a first signal source providing a first signal tracing an essentially exponential voltage curve;
   a electrode:
   a electron flow path coupled to said electrode;
   a resistance $R_L$ disposed between a voltage source and said electrode:
   a second signal source providing a second voltage signal in accordance with the equation $V_i = V_H - I_i R_L$ for i=1 to n where $I_i = (V_H/R_L)(1-e^{-i\alpha})$ and $V_H = V_{CC} - V_{BE}$ and $V_{BE}$ is a base to emitter voltage drop of a transistor coupled to said second signal source; and
   a comparator providing a timing signal whenever said second voltage signal becomes greater than said first signal.

6. The source of claim 5, wherein said electrode is a control electrode and said electron flow path is formed between said control electrode and said second signal source, said transistor having a voltage drop $V_{BE}$ thereacross, said voltage source $V_{CC}$ being coupled to one end of said electron flow path, and where in said resistance $R_L$ is coupled between said control electrode and said voltage source, the other end of said flow path providing a second voltage signal to said control electrode in accordance with the equation $V_i = V_H - I_i R_L$ for i=1 to n where $I_i = (V_H/R_L)(1-e^{-i\alpha})$ and $V_H = V_{CC} - V_{BE}$.

7. A source as set forth in claim 6, further including a current source disposed between said voltage source and said control electrode to provide a current $I_B = (V_H/R_L)e^{-i\alpha}$ between said voltage source and said control electrode and a current source between said control electrode and a source of reference voltage to provide a current $I_A = V_H/R_L$.

8. A source as set forth in claim 5, further including means to vary the value of i.

9. A source as set forth in claim 8, wherein said means to vary the value of i is a decoder.

10. A source as set forth in claim 6, further including means to vary the value of i.

11. A source as set forth in claim 10, wherein said means to vary the value of i is a decoder.

12. A source as set forth in claim 7, further including means to vary the value of i.

13. A source as set forth in claim 12, wherein said means to vary the value of i is a decoder.

* * * * *